United States Patent
Ryu et al.

(10) Patent No.: US 11,081,389 B2
(45) Date of Patent: Aug. 3, 2021

(54) METHOD OF MANUFACTURING SEMICONDUCTOR DEVICE

(71) Applicant: SAMSUNG ELECTRONICS CO., LTD., Suwon-si (KR)

(72) Inventors: Seung-min Ryu, Hwaseong-si (KR); Younsoo Kim, Yongin-si (KR); Gyu-hee Park, Hwaseong-si (KR); Jaesoon Lim, Seoul (KR); Younjoung Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/711,845

(22) Filed: Dec. 12, 2019

(65) Prior Publication Data

US 2020/0273747 A1 Aug. 27, 2020

(30) Foreign Application Priority Data

Feb. 21, 2019 (KR) .................. 10-2019-0020719

(51) Int. Cl.
*H01L 21/768* (2006.01)
*H01L 21/285* (2006.01)
*H01L 27/108* (2006.01)
*H01L 21/8238* (2006.01)

(52) U.S. Cl.
CPC .. *H01L 21/76843* (2013.01); *H01L 21/28556* (2013.01); *H01L 21/28568* (2013.01); *H01L 21/76877* (2013.01); *H01L 21/823871* (2013.01); *H01L 27/10814* (2013.01); *H01L 27/10826* (2013.01); *H01L 27/10852* (2013.01); *H01L 27/10879* (2013.01); *H01L 27/10897* (2013.01)

(58) Field of Classification Search
None
See application file for complete search history.

(56) References Cited

U.S. PATENT DOCUMENTS

| | | |
|---|---|---|
| 9,552,982 B2 | 1/2017 | Lavoie |
| 9,932,671 B2 | 4/2018 | Blackwell et al. |
| 10,074,541 B2 | 9/2018 | Blomberg et al. |
| 2016/0133837 A1 | 5/2016 | Hsueh et al. |
| 2017/0114452 A1 | 4/2017 | Peters |
| 2018/0061839 A1* | 3/2018 | Baars ............... H01L 29/7843 |
| 2018/0155827 A1 | 6/2018 | Yoon et al. |
| 2018/0274097 A1 | 9/2018 | Lei et al. |
| 2018/0277428 A1 | 9/2018 | Lakshmanan et al. |
| 2019/0252195 A1* | 8/2019 | Haukka ............ H01L 23/53242 |
| 2020/0091156 A1* | 3/2020 | Sharma ............ H01L 29/78693 |

* cited by examiner

*Primary Examiner* — Asok K Sarkar
(74) *Attorney, Agent, or Firm* — Lee IP Law, P.C.

(57) ABSTRACT

A method of manufacturing a semiconductor device, the method including providing a metal precursor on a substrate to form a preliminary layer that includes a first metal; providing a reducing agent on the preliminary layer, the reducing agent including a compound that includes a second metal; and providing a reactant on the preliminary layer to form a metal-containing layer, wherein the second metal has multiple oxidation states, the second metal in the reducing agent having a lower oxidation state among the multiple oxidation states prior to providing the reducing agent on the preliminary layer.

20 Claims, 24 Drawing Sheets

METHOD OF MANUFACTURING SEMICONDUCTOR DEVICE

CROSS-REFERENCE TO RELATED APPLICATION

Korean Patent Application No. 10-2019-0020719, filed on Feb. 21, 2019, in the Korean Intellectual Property Office, and entitled: "Method of Manufacturing Semiconductor Device," is incorporated by reference herein in its entirety.

BACKGROUND

1. Field

Embodiments relate to a method of manufacturing a semiconductor device.

2. Description of the Related Art

Semiconductor devices are widely used in the electronic industry because of their small size, multi-functionality, and/or low manufacturing cost. Semiconductor devices may encompass a memory device for storing data, a logic device for processing data, and a hybrid device for operating various functions contemporaneously or simultaneously.

SUMMARY

The embodiments may be realized by providing a method of manufacturing a semiconductor device, the method including providing a metal precursor on a substrate to form a preliminary layer that includes a first metal; providing a reducing agent on the preliminary layer, the reducing agent including a compound that includes a second metal; and providing a reactant on the preliminary layer to form a metal-containing layer, wherein the second metal has multiple oxidation states, the second metal in the reducing agent having a lower oxidation state among the multiple oxidation states prior to providing the reducing agent on the preliminary layer.

The embodiments may be realized by providing a method of manufacturing a semiconductor device, the method including forming an active pattern on a substrate; forming a gate electrode running across the active pattern; forming an active contact electrically connected to the active pattern and a gate contact electrically connected to the gate electrode, wherein forming the active contact and the gate contact includes forming a first hole exposing the active pattern and a second hole exposing the gate electrode; and forming a first metal-containing layer in the first hole and the second hole, forming the first metal-containing layer includes providing a first metal precursor on the substrate to form a first preliminary layer that includes a first metal; and providing a first reducing agent on the first preliminary layer, the first reducing agent including a compound that includes a second metal, the second metal having multiple oxidation states, and the second metal in the first reducing agent having a lower oxidation state among the multiple oxidation states prior to providing the first reducing agent on the first preliminary layer.

The embodiments may be realized by providing a method of manufacturing a semiconductor device, the method including forming a first region including a plurality of transistors; and forming a second region stacked on the first region, wherein forming the second region includes forming a semiconductor layer on the first region; forming an active pattern on the semiconductor layer; and forming a capacitor electrically connected to the active pattern, forming the capacitor includes forming a first electrode; forming a dielectric layer on the first electrode; and forming a second electrode on the dielectric layer, forming the first electrode or the second electrode includes providing a metal precursor on the semiconductor layer to form a preliminary layer that includes a first metal; and providing a reducing agent on the preliminary layer, the reducing agent including a compound that includes a second metal, the second metal having multiple oxidation states, and the second metal in the reducing agent having a lower oxidation state among the multiple oxidation states prior to providing the reducing agent on the preliminary layer.

BRIEF DESCRIPTION OF THE DRAWINGS

Features will be apparent to those of skill in the art by describing in detail exemplary embodiments with reference to the attached drawings in which.

DETAILED DESCRIPTION

FIGS. 1 to 5 illustrate cross-sectional views of stages in a method of forming a metal-containing layer according to some example embodiments.

Figure 1:
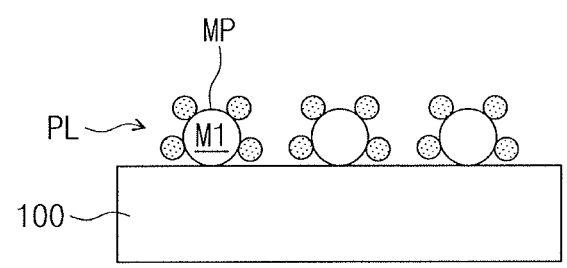
FIGS. 1 to 5 illustrate schematic cross-sectional views of stages in a method of forming a metal-containing layer according to some example embodiments.

Referring to FIG. 1, a substrate 100 may be provided. A metal precursor MP may be provided on the substrate 100 to form a preliminary layer PL. An atomic layer deposition (ALD) or chemical vapor deposition (CVD) process may be used to form a metal-containing layer according to some example embodiments. The atomic layer deposition (ALD) or chemical vapor deposition (CVD) process may be performed at a process temperature of about 50° C. to about 800° C. In an implementation, the process temperature may fall within a range from about 150° C. to about 400° C. The atomic layer deposition (ALD) or chemical vapor deposition (CVD) process may be performed at a process pressure of about 0 Torr to about 100 Torr.

In an implementation, the metal precursor MP may be, e.g., a metal halide compound that includes a first metal M1 or a metal organic (organometallic) compound that includes the first metal M1. In an implementation, the first metal M1 may include, e.g., Ti, Ta, Co, W, Ru, Mo, Sn, Cu. or Al. As used herein, the term "or" is not an exclusive term, e.g., "A or B" would include A, B, or A and B. In an implementation, the metal halide compound may include, e.g., $TiCl_4$, $WF_6$, $HfCl_4$, $NbCl_5$, or $TaCl_5$. In an implementation, the metal organic compound may include, e.g., PDMAT (pentakis(dimethylamino)tantalum) or TBTEMT (tert-butylimido-tris-ethylmethylamido-tantalum).

Figure 2:
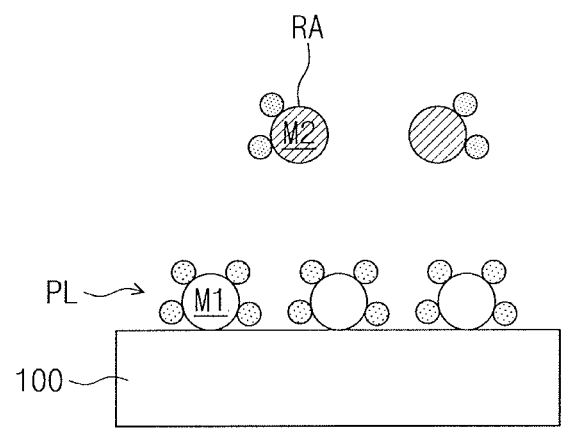

Referring to FIG. 2, a reducing agent RA may be provided on the preliminary layer PL. The reducing agent RA may include a second metal M2. The second metal M2 may have multiple oxidation states. In an implementation, the second metal M2 may include, e.g., Cr, Co, Mo, Ru, Ir, Pt, Cu, Fe, W, Ti, V, Mn, Ni, or Sn. The second metal M2 may have multiple oxidation states as follows.

Cr (+3,+6), Co (+2,+3), Mo (+4,+6), Ru (+2,+3,+4), Ir (+3,+6), Pt (+2,+4), Cu (+1,+2), Fe (+2,+3), W (0,+4), Ti (+3,+4), V (+4,+5), Mn (+2,+3), Ni (0,+2), or Sn (+2,+4).

The second metal M2 may be more chemically stable at a high oxidation state than at a low oxidation state. For example, the second metal M2 may be more chemically stable at a state having a high oxidation number than at a state having a low oxidation number.

For example, tin (Sn) may have an oxidation number of +2, or low oxidation state, in a compound A. Tin (Sn) may have an oxidation number of +4, or high oxidation state, in a compound B. The compound B may be more chemically stable than the compound A. The compound A may tend to be oxidized to convert into the compound B.

The second metal M2 of the reducing agent RA may have a low oxidation state among the multiple oxidation states. For example, when the reducing agent RA includes Sn as the second metal M2, the Sn may have an oxidation number of +2. For example, the reducing agent RA may correspond with the compound A that is more chemically unstable among the compound A and the compound B.

In an implementation, the reducing agent RA may include a first compound expressed by a chemical formula R1-M2-R2. In the chemical formula R1-M2-R2, M2 may be a metal whose oxidation number is 0. M2 of the first compound may be, e.g., Ni or W. R1 and R2 may independently be, e.g., hydrogen, a C6-C12 aromatic group, or a cyanide derivative. The aromatic group may include, e.g., a phenyl group, a benzyl group, or a phenoxy group.

In an implementation, the reducing agent RA may include a second compound expressed by a chemical formula M2-R3. In the chemical formula M2-R3, M2 may be a metal whose oxidation number is 1. M2 of the second compound may be, e.g., Cu. R3 may be, e.g., hydrogen, an alkyl group, an amide group, a diamine group, a halogen, or an N-heterocyclic derivative.

In an implementation, the reducing agent RA may include a third compound expressed by a chemical formula R4-M2-R5. In the chemical formula R4-M2-R5, M2 may be a metal whose oxidation number is 2. M2 of the third compound may be, e.g., Co, Ru, Pt, Mn, or Sn. R4 and R5 may independently be, e.g., hydrogen, a C1-C8 linear or branched alkyl group, a C3-C8 cycloalkyl group, an alkoxy group, an amide group, a halogen, an amidine group, a C5-C15 aromatic group, or an N-heterocyclic derivative.

In an implementation, the third compound may include a compound expressed by Chemical Formula 1 below, a compound expressed by Chemical Formula 2 below, or a compound expressed by Chemical Formula 3 below.

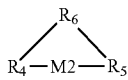

[Chemical Formula 1]

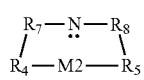

[Chemical Formula 2]

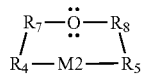

[Chemical Formula 3]

In Chemical Formulae 1 to 3, R4 and R5 may independently be, e.g., hydrogen, a C1-C8 linear or branched alkyl group, a C3-C8 cycloalkyl group, an alkoxy group, an amide group, a halogen, an amidine group, a C5-C15 aromatic group, or an N-heterocyclic derivative. R6 may be, e.g., a C1-C12 alkyl group, an amide group, or an alkoxy group. R7 and R8 may independently be, e.g., a C1-C5 linear or branched alkyl group.

In an implementation, the third compound may include a compound expressed by Chemical Formula 4 below.

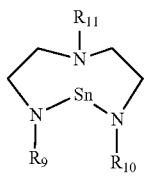

[Chemical Formula 4]

In Chemical Formula 4, the second metal M2 may be Sn having an oxidation number of +2. R9, R10, and R11 may independently be, e.g., hydrogen, a C1-C5 linear or branched alkyl group, a C3-C8 cycloalkyl group, or an amide group.

In an implementation, the third compound may include a compound expressed by Chemical Formula 5 below.

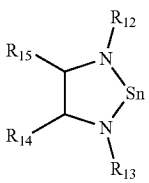

[Chemical Formula 5]

In Chemical Formula 5, the second metal M2 may be Sn having an oxidation number of +2. R12, R13, and R14 may independently be, e.g., hydrogen, a C1-C5 linear or branched alkyl group, or a C3-C8 cycloalkyl group.

In an implementation, the reducing agent RA may include a fourth compound expressed by Chemical Formula RA4, below.

[Chemical Formula RA4]

In Chemical Formula RA4, M2 may be a metal whose oxidation number is 3. M2 may be, e.g., Cr, Ti, or Ir. R16, R17, and R18 may independently be, e.g., hydrogen, a C1-C8 linear or branched alkyl group, a C3-C8 cycloalkyl group, a halogen, a N-heterocyclic amide group, an alkoxy group, an amidine group, a β-diketonate group, a β-diketimine group, or a ketoimine group.

In an implementation, the reducing agent RA may include a fifth compound expressed by Chemical Formula RA5, below.

[Chemical Formula RA5]

In Chemical Formula RA5, M2 may be a metal whose oxidation number is 4. M2 may be, e.g., Mo or V. R19, R20, R21, and R22 may independently be hydrogen, a C1-C10 alkyl group, an amide group, an alkoxy group, a halogen, or an amidine group.

Figure 3:
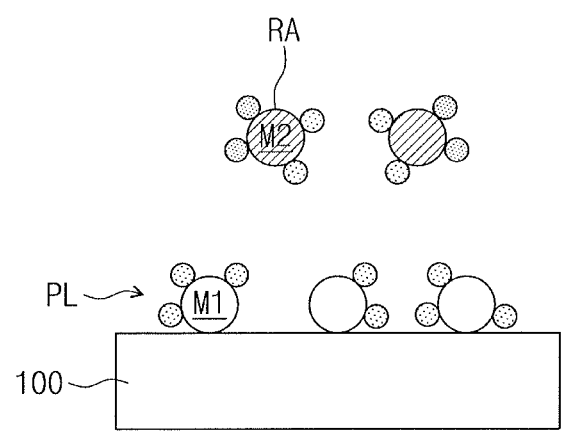

Referring to FIG. 3, the reducing agent RA may reduce the first metal M1 of the preliminary layer PL. The reducing agent RA may be oxidized on the preliminary layer PL. The second metal M2 of the reducing agent RA may be changed from a low oxidation state into a high oxidation state. The second metal M2 of the reducing agent RA may increase in oxidation number (e.g., by reducing the first metal M1 of the preliminary layer PL). The reducing agent RA may be oxidized into a compound that is more chemically stable. The preliminary layer PL may be reduced to decrease the oxidation number of the first metal M1.

For example, the substrate 100 may be provided with a TiCl$_4$ precursor to form the preliminary layer PL. The preliminary layer PL may be provided thereon with the reducing agent RA (e.g., the third compound) that contains Sn having an oxidation number of +2. The reducing agent RA may be oxidized to increase the oxidation number of Sn from +2 to +4. The preliminary layer PL may be reduced to decrease the oxidation number of Ti from +4 to +3. As the reducing agent RA is oxidized, a bond of Ti—Cl in the preliminary layer PL may be broken and Cl may be combined with the third compound or the reducing agent RA.

The oxidized reducing agent RA may be removed. For example, the reducing agent RA may not remain in or on the preliminary layer PL, but may be (e.g., entirely) removed. The removal of the reducing agent RA may include purging gases from a process chamber. In one implementation, the reducing agent RA may serve as a catalyst in the formation reaction of a metal-containing layer according to some example embodiments.

Figure 4:
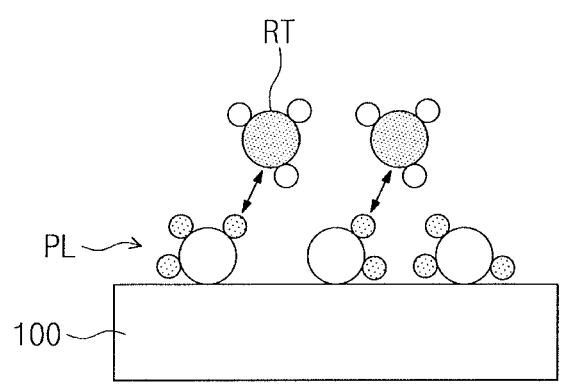

Referring to FIG. 4, a reactant RT may be provided on the preliminary layer PL. The reactant RT may react with the preliminary layer PL. In an implementation, the reactant RT may include, e.g., NH$_3$, N$_2$H$_4$, H$_2$, or N$_2$.

In an implementation, the reducing agent RA may be provided on the preliminary layer PL, and thereafter the reactant RT may be provided on the preliminary layer PL (e.g., sequentially). In an implementation, the reducing agent RA and the reactant RT may be simultaneously provided on the preliminary layer PL.

Figure 5:
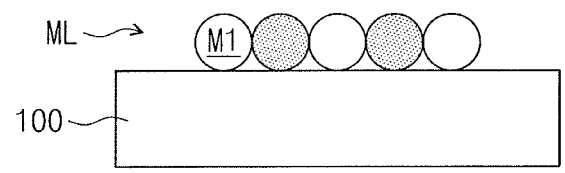

Referring to FIG. 5, the preliminary layer PL and the reactant RT may react with each other to form a metal-containing layer ML. Byproducts produced during the reaction may all be removed. For example, when the reactant RT includes nitrogen atoms, the metal-containing layer ML may be a metal nitride layer including the first metal M1. In an implementation, when the reactant RT does not include nitrogen atoms, the metal-containing layer ML may be a metal layer composed of only the first metal M1.

In an implementation, the metal-containing layer ML may not include the second metal M2. In an implementation, while the preliminary layer PL is reduced, the second metal M2 of the reducing agent RA may diffuse into the preliminary layer PL and the metal-containing layer ML may include a slight amount of the second metal M2. In an implementation, an amount of the second metal M2 in the metal-containing layer ML may be, e.g., about 0.1 at % to about 10 at %.

If an atomic layer deposition (ALD) or chemical vapor deposition (CVD) process were to be performed using the metal precursor MP and the reactant RT without the reducing agent RA, a high process temperature (e.g., more than about 500° C.) may be required. The high process temperature may be required due to the reaction between the metal precursor MP and the reactant RT to form the metal nitride layer or the metal layer being a reaction thermodynamically performed at a high temperature.

According to some example embodiments, the reducing agent RA may reduce the preliminary layer PL even at low temperatures (e.g., between about 150° C. and 400° C.). As a result, the metal-containing layer ML may be formed at low temperatures. For example, the reducing agent RA according to some example embodiments may help decrease activation energy for the formation reaction of the metal-containing layer ML.

Figure 6:
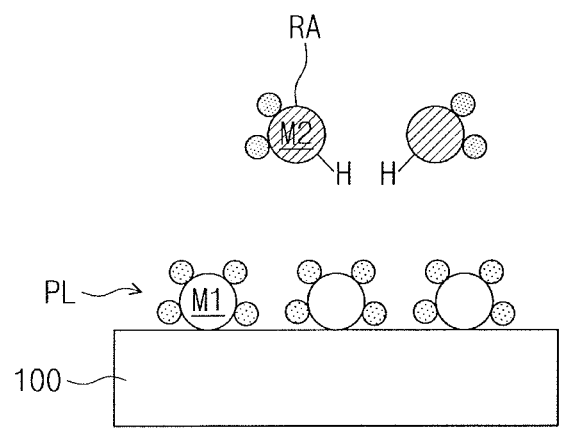
FIGS. 6 and 7 illustrate schematic cross-sectional views of stages in a method of forming a metal-containing layer according to some example embodiments.
Figure 7:
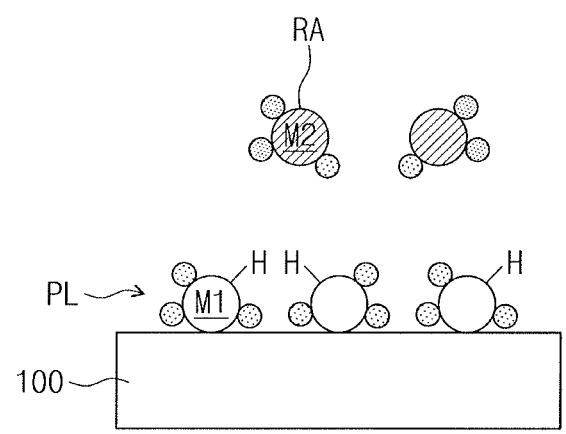
Figure 8:
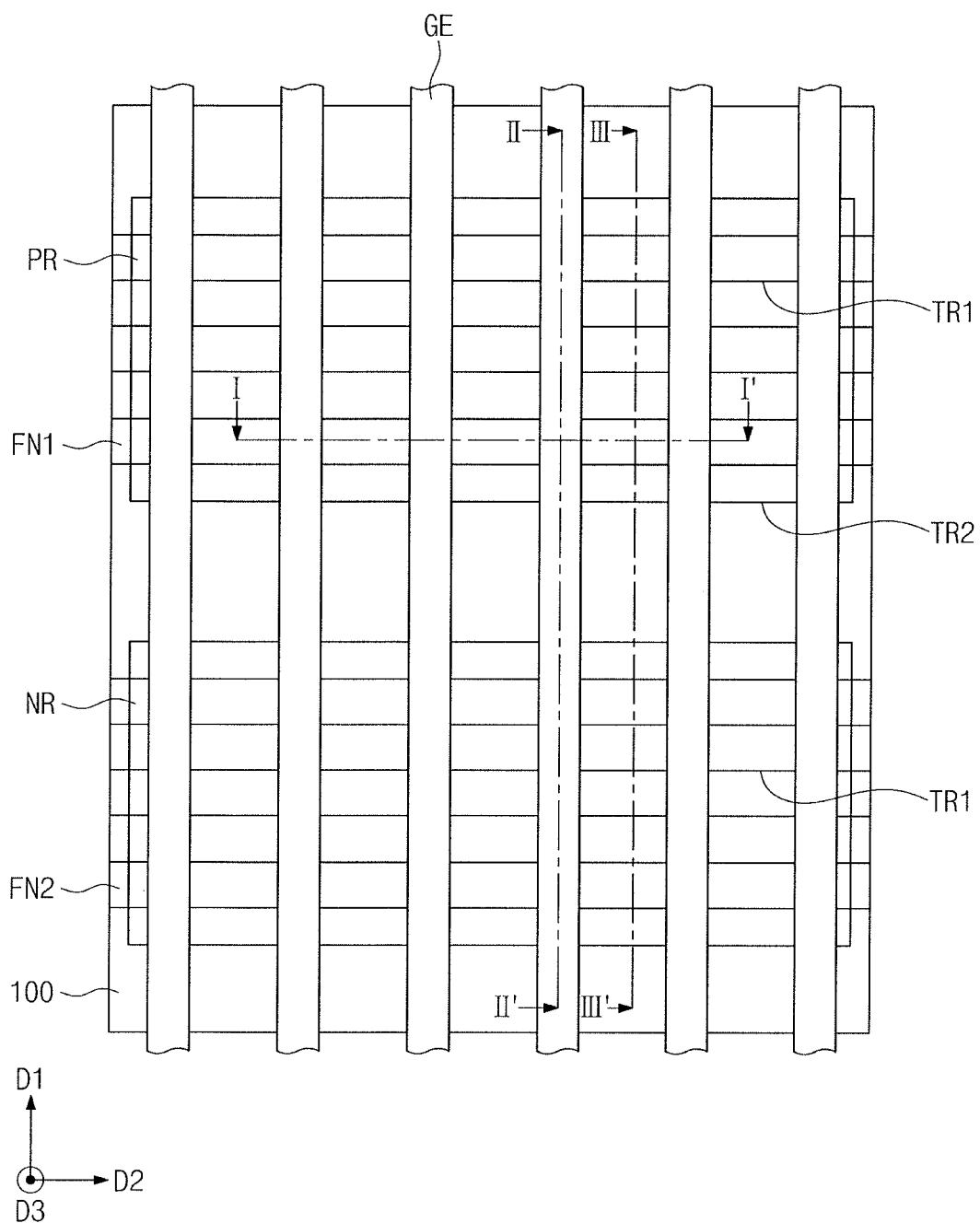
FIGS. 8, 10, 12, and 14 illustrate plan views of stages in a method of manufacturing a semiconductor device according to some example embodiments.
Figure 9A:
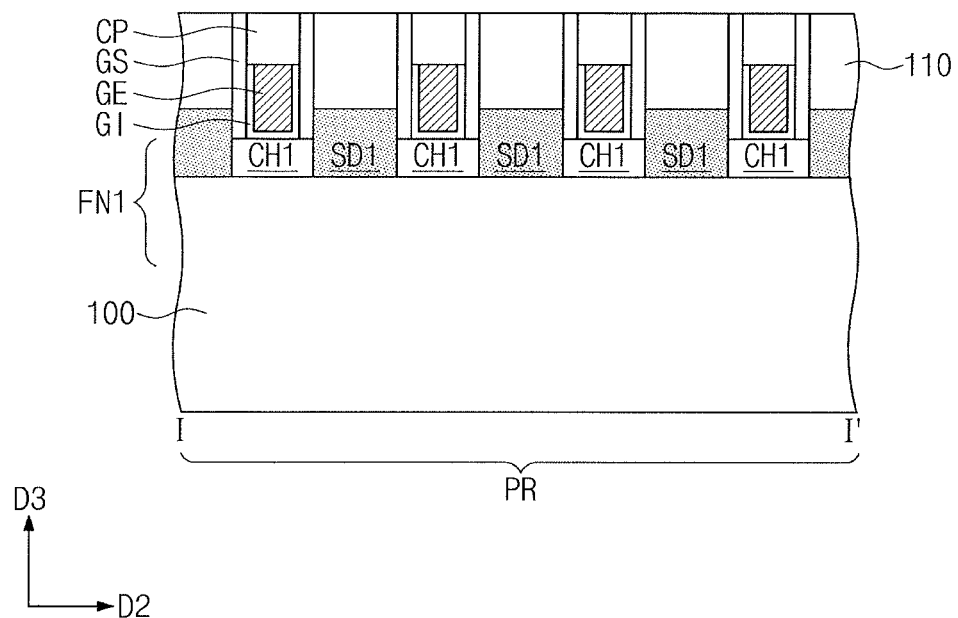
FIGS. 9A, 11A, 13A, and 15A illustrate cross-sectional views taken along line I-I' of FIGS. 8, 10, 12, and 14, respectively.
Figure 9B:
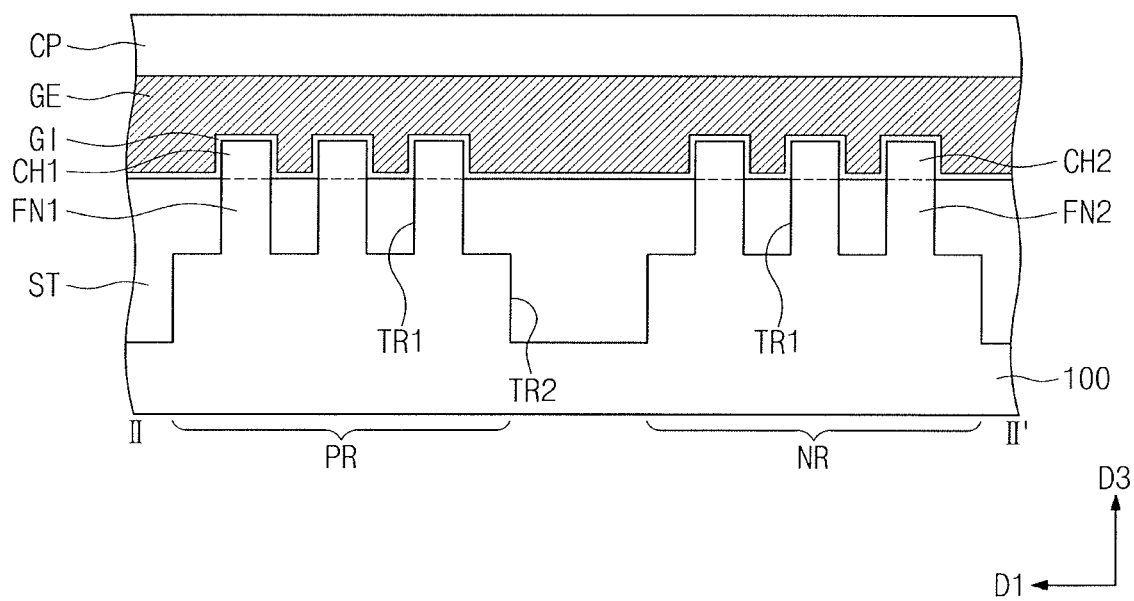
FIGS. 9B, 11B, 13B, and 15B illustrate cross-sectional views taken along line II-II' of FIGS. 8, 10, 12, and 14, respectively.
Figure 9C:
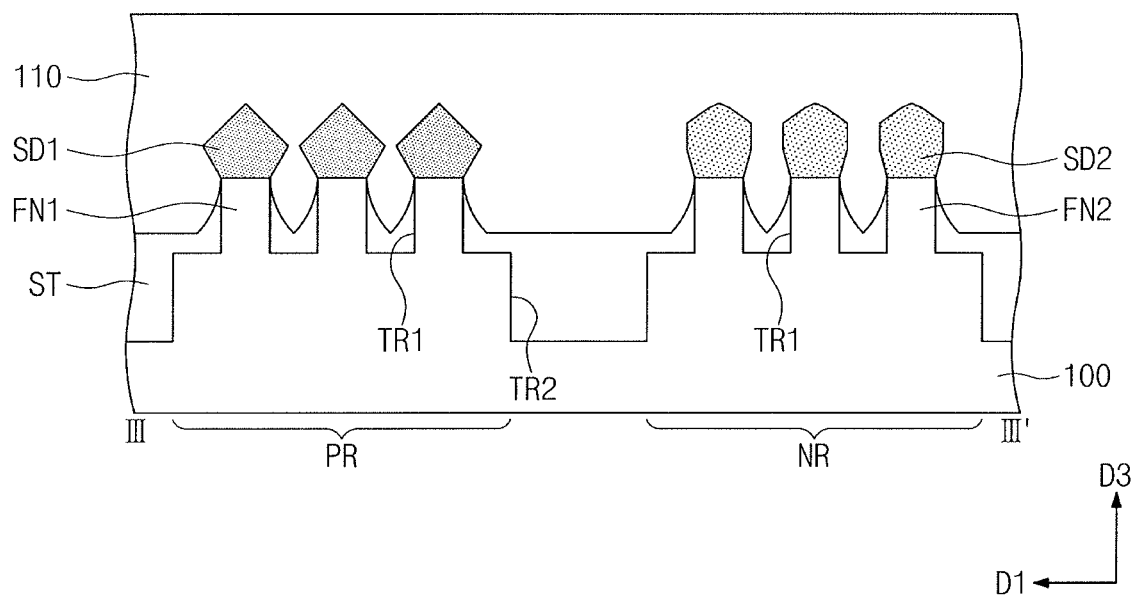
FIGS. 9C, 11C, 13C, and 15C illustrate cross-sectional views taken along line III-III' of FIGS. 8, 10, 12, and 14, respectively.
Figure 10:
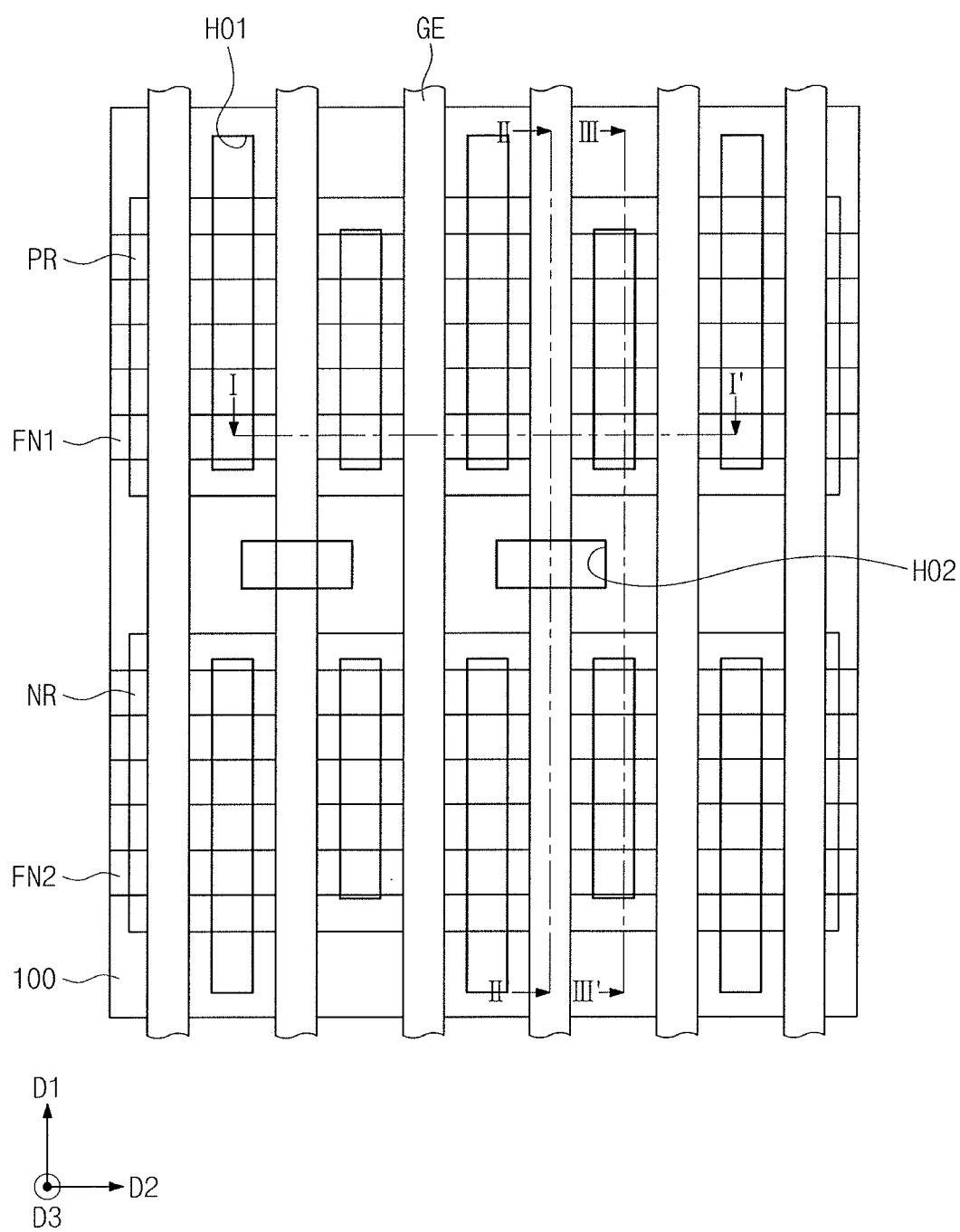
Figure 11A:
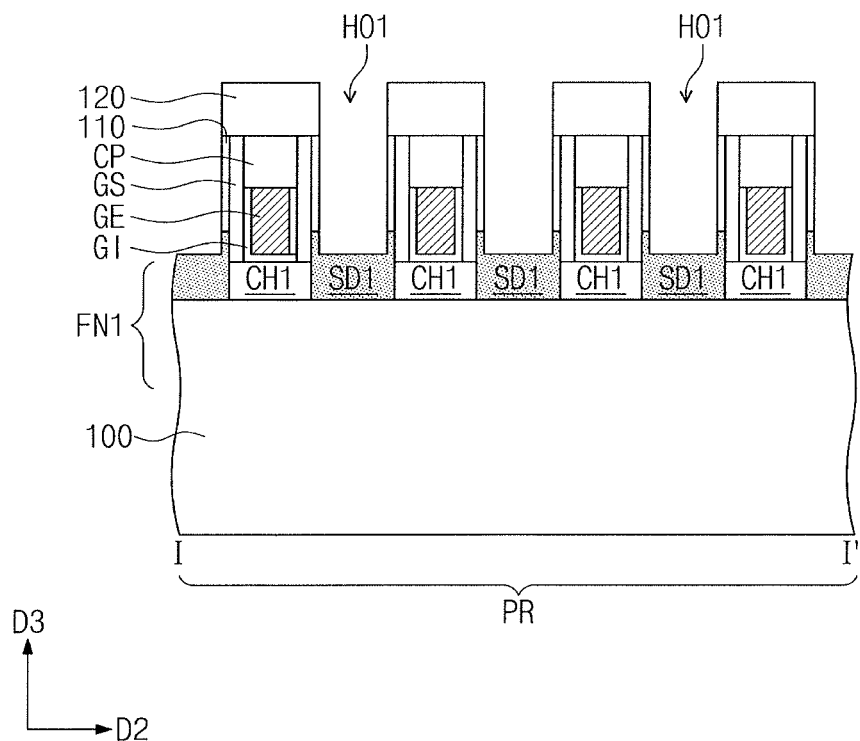
Figure 11B:
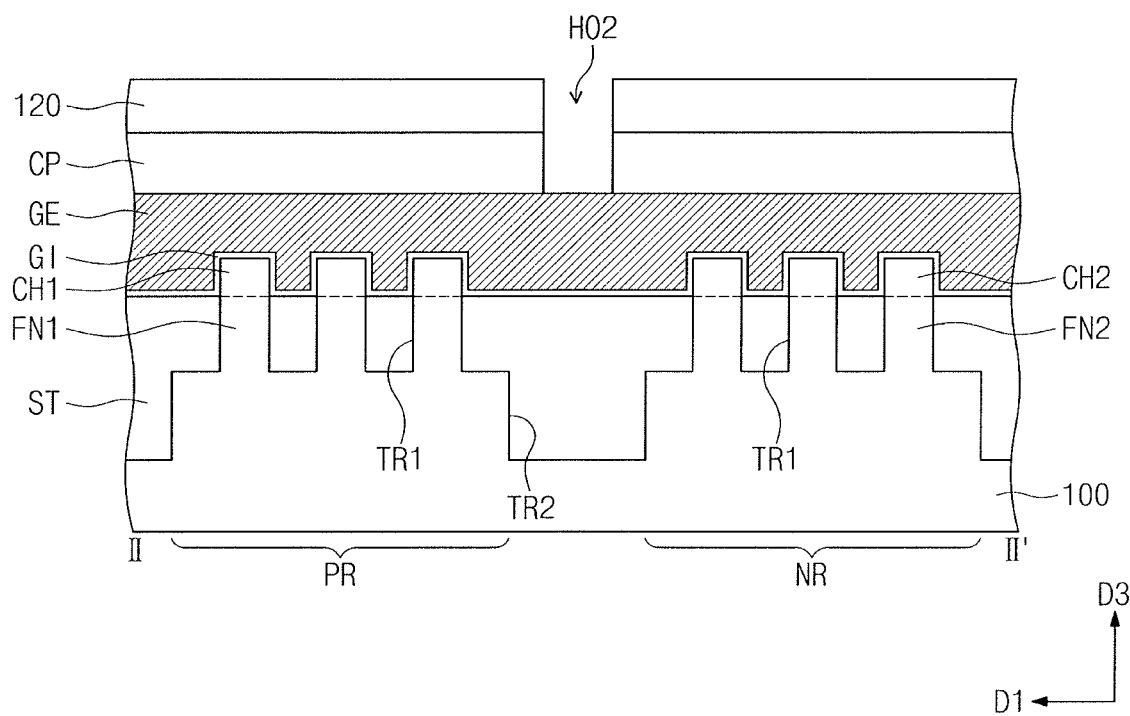
Figure 11C:
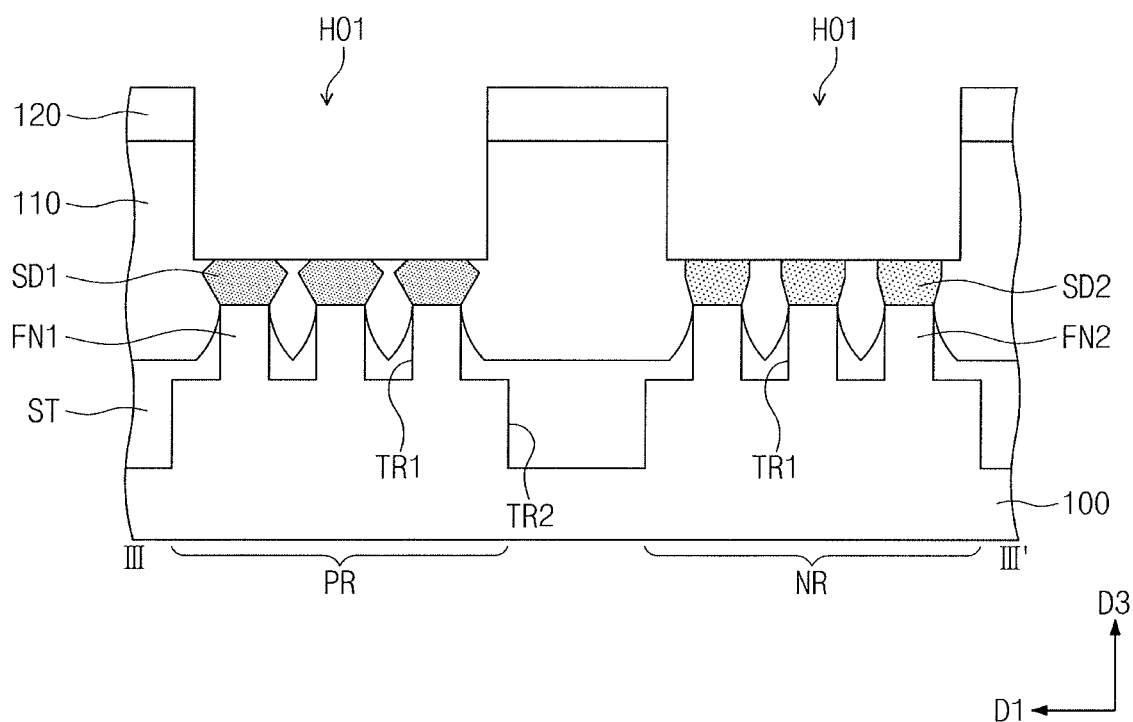
Figure 12:
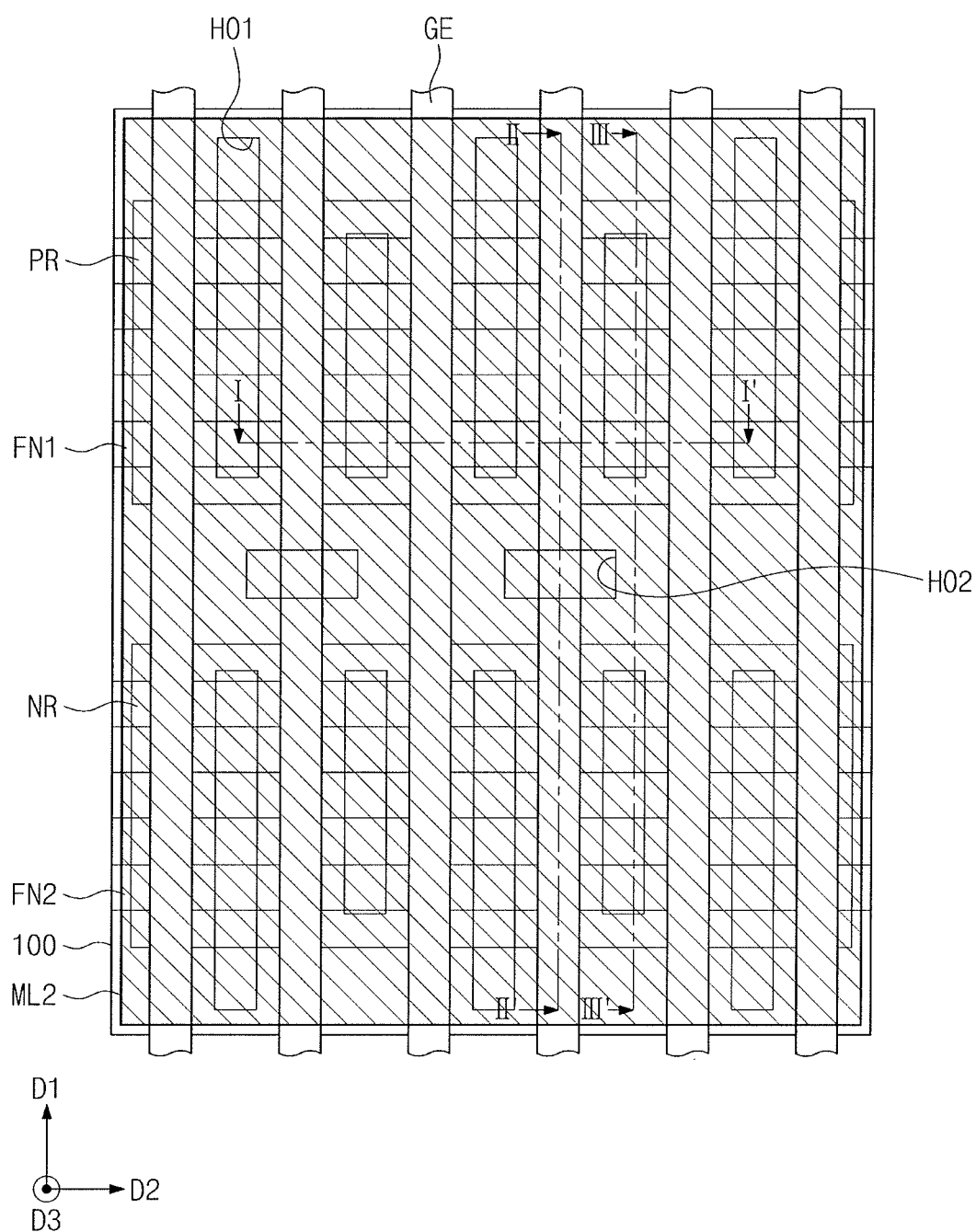
Figure 13A:
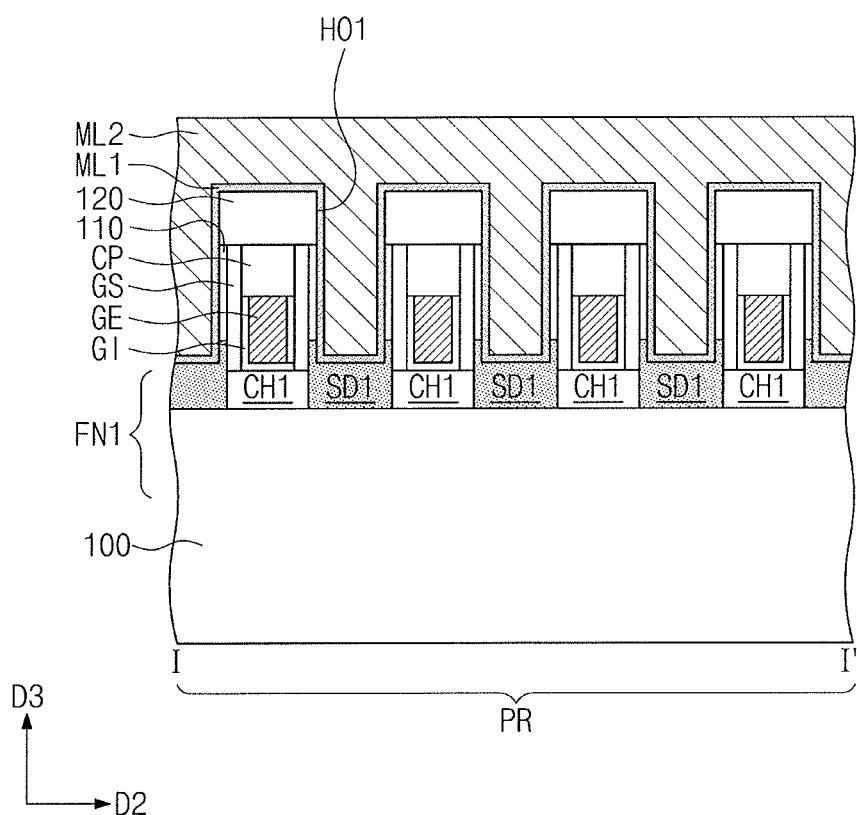
Figure 13B:
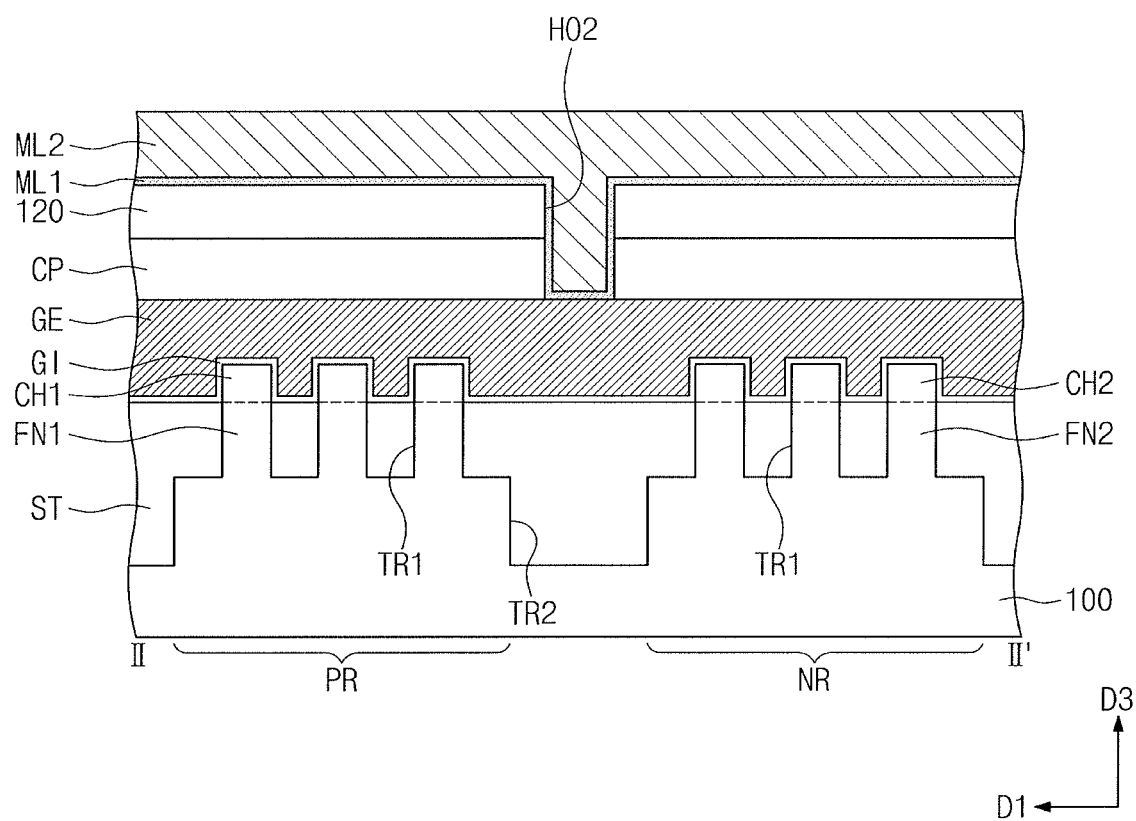
Figure 13C:
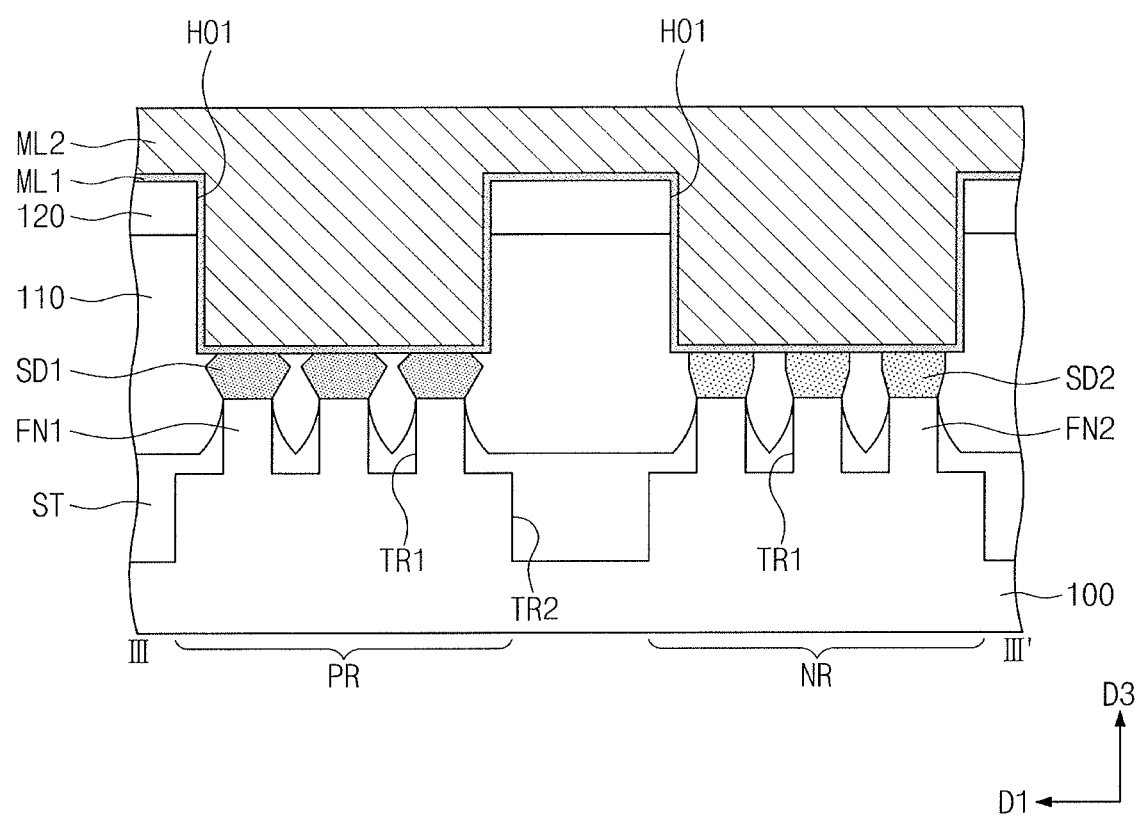
Figure 14:
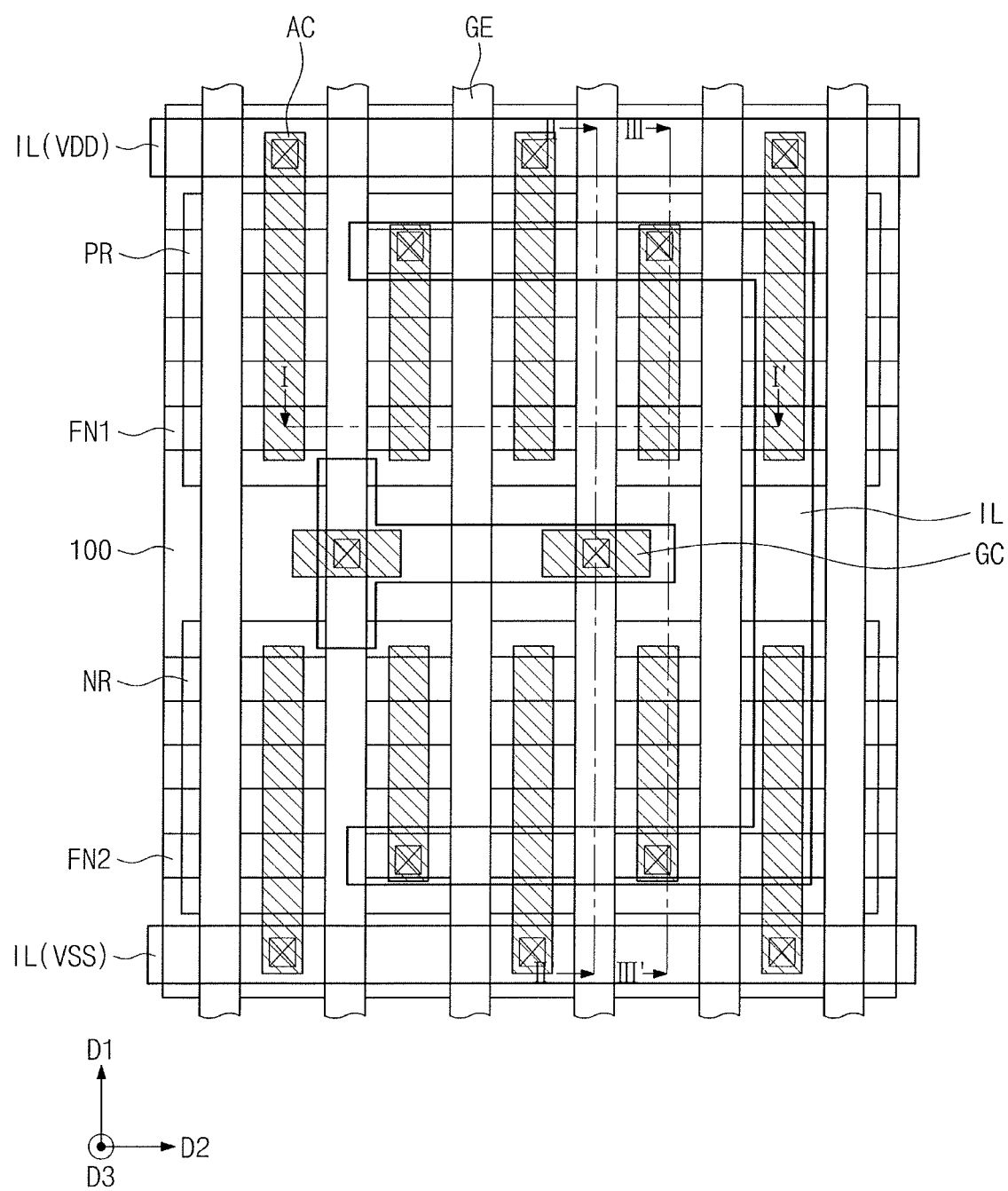
Figure 15A:
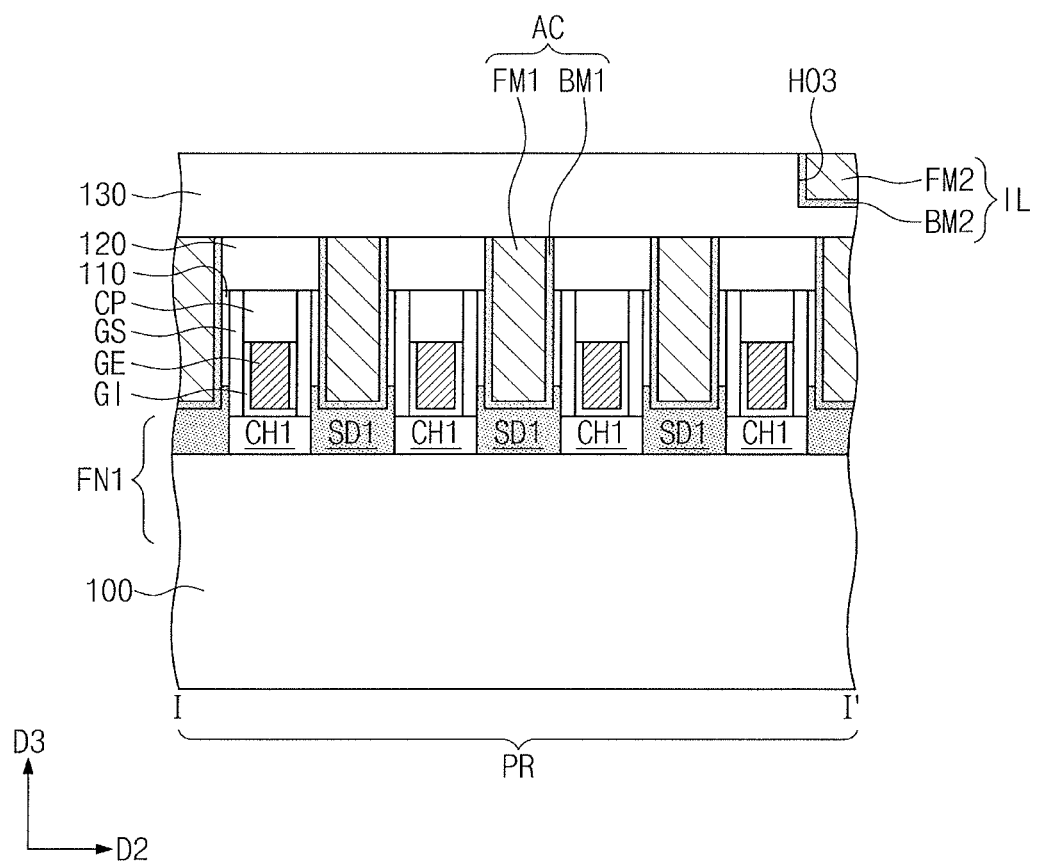
Figure 15B:
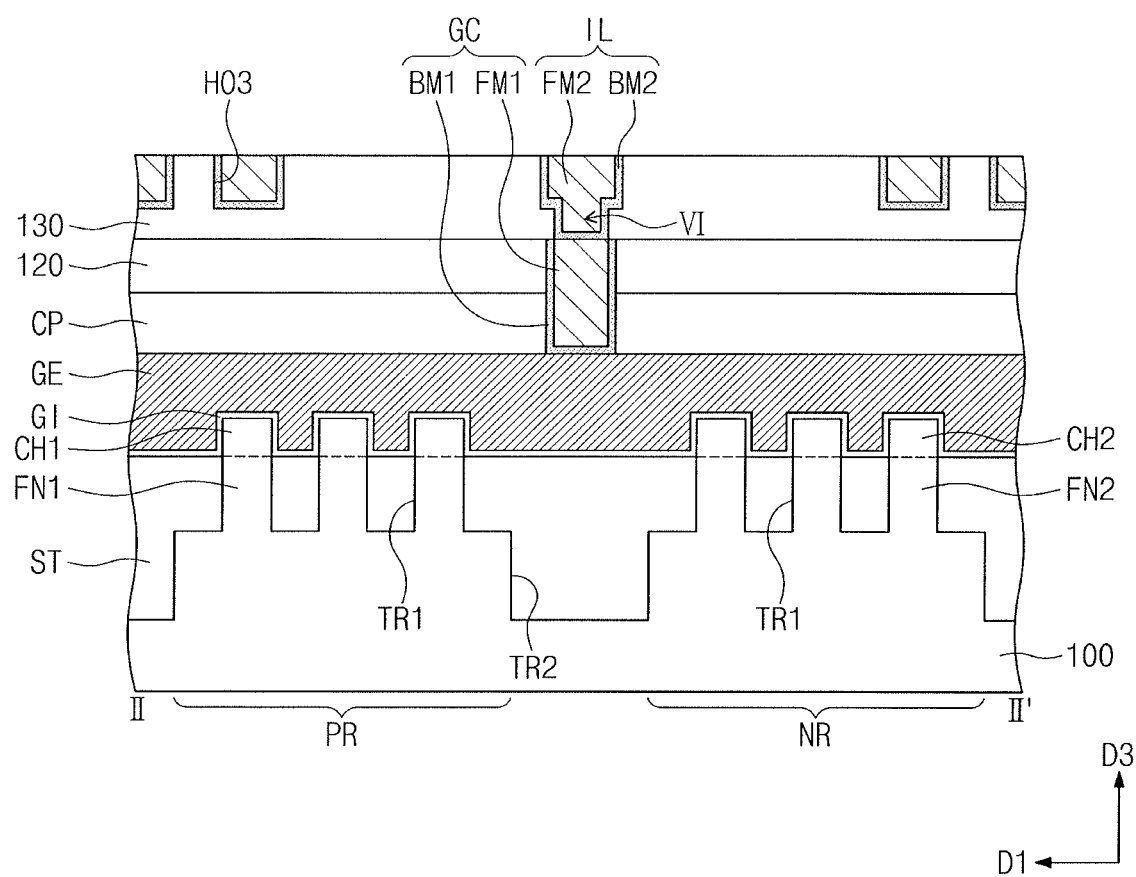
Figure 15C:
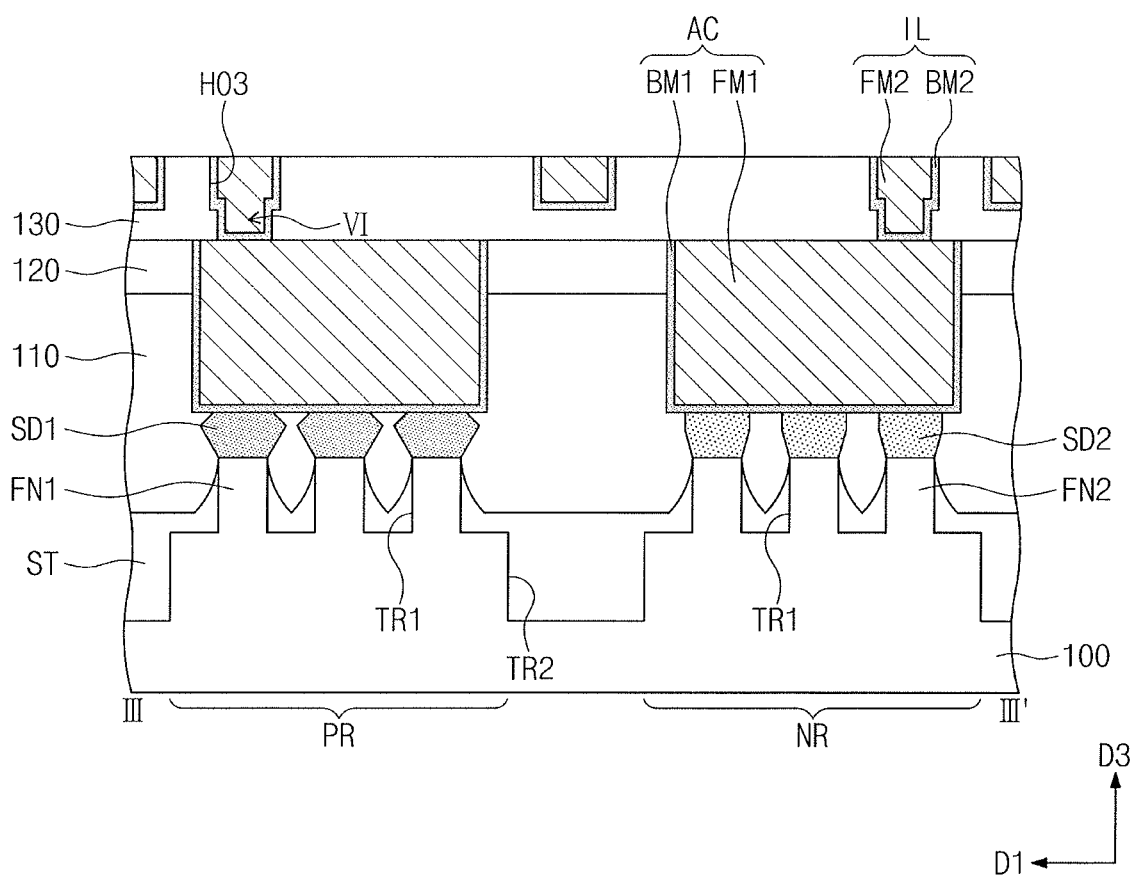

FIGS. 6 and 7 illustrate cross-sectional views of stages in a method of forming a metal-containing layer according to some example embodiments. In the embodiment that follows, a repeated detailed description of technical features corresponding with those discussed with reference to FIGS. 1 to 5 may be omitted, and a difference thereof will be discussed in detail.

Referring to FIG. 6, a reducing agent RA may be provided on the preliminary layer PL of FIG. 1. The reducing agent RA may include a second metal M2.

The reducing agent RA may include a bond between the second metal M2 and hydrogen (H), e.g., a M2-H bond. For example, the reducing agent RA may have a hydride form. A compound having the M2-H bond may be chemically unstable, and thus may tend to be oxidized to break the M2-H bond. The second metal M2 capable of having the hydride form may include, e.g., Li, Na, K, Be, Mg, Ca, B, Al, Ga, Si, Ge, Sn, P, or S.

Referring to FIG. 7, the reducing agent RA may reduce the first metal M1 of the preliminary layer PL. The reducing agent RA may be oxidized on the preliminary layer PL. The preliminary layer PL may be reduced. For example, the M2-H bond of the reducing agent RA may be broken, and a bond between the first metal M1 and hydrogen (H), or M1-H bond, may be produced.

For example, the substrate 100 may be provided with a TiCl$_4$ precursor to form the preliminary layer PL. The preliminary layer PL may be provided with the reducing agent RA having the M2-H bond. The reducing agent RA may be oxidized to break the M2-H bond. The preliminary layer PL may be reduced to break Ti—Cl bonds. Cl may be combined with the second metal M2, and H may be combined with the first metal M1 of the preliminary layer PL.

Afterwards, as discussed above with reference to FIGS. 4 and 5, the preliminary layer PL may be provided thereon with the reactant RT to form the metal-containing layer ML.

The following Experimental Example and Comparative Examples are provided in order to highlight characteristics of one or more embodiments, but it will be understood that the Experimental Example and Comparative Examples are not to be construed as limiting the scope of the embodiments, nor are the Comparative Examples to be construed as being outside the scope of the embodiments. Further, it will be understood that the embodiments are not limited to the particular details described in the Experimental Example.

EXPERIMENTAL EXAMPLE

Figure 21:
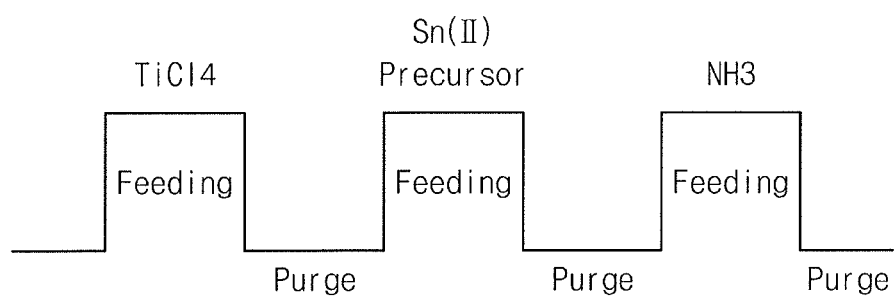
FIG. 21 illustrates a recipe for the Experimental Example.

A condition discussed below was employed to perform an experiment to form a low-resistance TiN layer. FIG. 21 illustrates a recipe for the Experimental Example.

A substrate underwent an ALD process that used a recipe including the following sequence: $TiCl_4$ feeding—$TiCl_4$ purge—Sn(II) precursor feeding—Sn(II) precursor purge—$NH_3$ feeding—$NH_3$ purge. Consequently, a TiN layer was formed on the substrate (Experimental Example 1). The Sn(II) precursor was a reducing agent expressed by Chemical Formula 4 above.

As a Comparative Example, a TiN layer was deposited on a substrate without using a Sn(II) precursor (Comparative Example 1).

By comparing the resistance of the TiN layer of Experimental Example 1 and the resistance of the TiN layer of Comparative Example 1, it was seen that the resistance of the TiN layer of Experimental Example 1 was less than half the resistance of the TiN layer of Comparative Example 1.

When a TiN layer becomes thinner, the TiN layer may have a tendency to increase in resistivity due to a surface scattering effect. According to the above Experimental Example, it was ascertained that the increase in resistivity of the TiN layer, deposited using Sn(II) precursor, of Experimental Example 1 was suppressed, when compared to the TiN layer of Comparative Example 1.

FIGS. 8, 10, 12, and 14 illustrate plan views of stages in a method of manufacturing a semiconductor device according to some example embodiments. FIGS. 9A, 11A, 13A, and 15A illustrate cross-sectional views taken along line I-I' of FIGS. 8, 10, 12, and 14, respectively. FIGS. 9B, 11B, 13B, and 15B illustrate cross-sectional views taken along line II-II' of FIGS. 8, 10, 12, and 14, respectively. FIGS. 9C, 11C, 13C, and 15C illustrate cross-sectional views taken along line of FIGS. 8, 10, 12, and 14, respectively.

Referring to FIGS. 8 and 9A to 9C, a substrate 100 may be provided. For example, the substrate 100 may be a silicon substrate, a germanium substrate, or a silicon-on-insulator (SOI) substrate. An upper portion of the substrate 100 may be patterned to form first trenches TR1 extending in a second direction D2. The first trenches TR1 may define first and second active patterns FN1 and FN2 on the upper portion of the substrate 100. The first and second active patterns FN1 and FN2 may be arranged along a first direction D1.

An upper portion of the substrate 100 may be patterned to form a second trench TR2 defining a first active region PR and a second active region NR. While the second trench TR2 is formed, the first and second active patterns FN1 and FN2 may be removed from an area in which the second trench TR2 is formed. The first active pattern FN1 may be provided on the first active region PR, and the second active pattern FN2 may be provided on the second active region NR. The second trench TR2 may be deeper than the first trenches TR1.

A device isolation layer ST may be formed to fill the first and second trenches TR1 and TR2. Silicon oxide may be used to form the device isolation layer ST. For example, the formation of the device isolation layer ST may include forming on the substrate 100 a dielectric layer that fills the first and second trenches TR1 and TR2, and recessing the dielectric layer until the first and second active patterns FN1 and FN2 are exposed on their upper portions.

Gate electrodes GE may be formed to extend in the first direction D1, while running across the first and second active patterns FN1 and FN2. Gate dielectric layers GI may be formed below the gate electrodes GE. Gate spacers GS may be formed on opposite sides of each of the gate electrodes GE. Gate capping layers CP may be formed on the gate electrodes GE.

For example, the formation of the gate electrodes GE may include forming sacrificial patterns to run across the first and second active patterns FN1 and FN2, forming the gate spacers GS on opposite sides of each of the sacrificial patterns, and replacing the sacrificial patterns with the gate electrodes GE.

The gate electrodes GE may include a conductive metal nitride (e.g., titanium nitride or tantalum nitride) or a (non-compounded) metal (e.g., titanium, tantalum, cobalt, tungsten, ruthenium, molybdenum, tin, copper, or aluminum). The formation of the gate electrodes GE may include the formation of the metal-containing layer ML discussed above with reference to FIGS. 1 to 7 according to some example embodiments.

The gate dielectric layers GI may include a high-k dielectric material whose dielectric constant is greater than that of a silicon oxide layer. The gate spacers GS may include, e.g., SiCN, SiCON, or SiN. The gate capping layers CP may include, e.g., SiON, SiCN, SiCON, or SiN.

First source/drain regions SD1 may be formed on upper portions of the first active patterns FN1. Second source/drain regions SD2 may be formed on upper portions of the second active patterns FN2. The first and second source/drain regions SD1 and SD2 may be formed on opposite sides of each of the gate electrodes GE. The first source/drain regions SD1 may be doped with p-type impurities, and the second source/drain regions SD2 may be doped with n-type impurities.

The first and second source/drain regions SD1 and SD2 may be epitaxial patterns, which epitaxial patterns may be formed by a selective epitaxial growth process. For example, a partial recess process may be performed on the first and second active patterns FN1 and FN2 on opposite sides of each of the gate electrodes GE, and then an epitaxial growth process may be performed on the recessed portions of the first and second active patterns FN1 and FN2.

A first interlayer dielectric layer 110 may be formed on an entire surface of the substrate 100. The first interlayer dielectric layer 110 may be formed of a silicon oxide layer or a silicon oxynitride layer. The first interlayer dielectric layer 110 may have a top surface substantially coplanar with those of the gate spacers GS and those of the gate capping layers CP.

Referring to FIGS. 10 and 11A to 11C, a second interlayer dielectric layer 120 may be formed on the first interlayer dielectric layer 110. First holes HO1 may be formed to penetrate the first and second interlayer dielectric layers 110 and 120. Second holes HO2 may be formed to penetrate the second interlayer dielectric layer 120 and the gate capping layers CP.

Each of the first holes HO1 may be formed between adjacent gate electrodes GE. Each of the first holes HO1 may expose the first source/drain region SD1 or the second source/drain region SD2. The second holes HO2 may be formed on the device isolation layer ST filling the second trench TR2. Each of the second holes HO2 may expose at least a portion of a top surface of the gate electrode GE.

Referring to FIGS. 12 and 13A to 13C, a first metal-containing layer ML1 and a second metal-containing layer ML2 may be formed to sequentially fill the first and second holes HO1 and HO2. For example, the first metal-containing layer ML1 may be conformally formed on the substrate 100. The first metal-containing layer ML1 may include a metal nitride layer, e.g., a titanium nitride layer, a tungsten nitride layer, or a tantalum nitride layer. The formation of the first metal-containing layer ML1 may include the formation of the metal-containing layer ML discussed above with reference to FIGS. 1 to 7 according to some example embodiments.

The second metal-containing layer ML2 may be formed on the first metal-containing layer ML1. The second metal-containing layer ML2 may include a metal layer containing, e.g., titanium, tantalum, cobalt, tungsten, ruthenium, molybdenum, tin, copper, or aluminum. The formation of the second metal-containing layer ML2 may include the formation of the metal-containing layer ML discussed above with reference to FIGS. 1 to 7 according to some example embodiments. The second metal-containing layer ML2 may completely fill the first and second holes HO1 and HO2.

The first metal-containing layer ML1 or the second metal-containing layer ML2 may include the second metal M2 of the reducing agent RA discussed above with reference to FIGS. 1 to 7. An amount of the second metal M2 included in the first metal-containing layer ML1 or the second metal-containing layer ML2 may be, e.g., about 0.1 at % to about 10 at %.

Referring to FIGS. 14 and 15A to 15C, a planarization process may be performed on the first metal-containing layer ML1 and the second metal-containing layer ML2 until a top surface of the second interlayer dielectric layer 120 is exposed, and accordingly, active contacts AC and gate contacts GC may be formed respectively in the first holes H01 and the second holes H02. Each of the active contact AC and the gate contact GC may include a first barrier pattern BM1 and a first conductive pattern FM1.

A third interlayer dielectric layer 130 may be formed on the second interlayer dielectric layer 120. The third interlayer dielectric layer 130 may be patterned to form third holes HO3 in the third interlayer dielectric layer 130.

Interconnection lines IL may be formed to fill the third holes HO3. Each of the interconnection lines IL may include a second barrier pattern BM2 and a second conductive pattern FM2.

The formation of the interconnection lines IL may include forming a third metal-containing layer on the substrate 100 and forming a fourth metal-containing layer on the third metal-containing layer. The formation of the third and fourth metal-containing layers may include the formation of the metal-containing layer ML discussed above with reference to FIGS. 1 to 7 according to some example embodiments. In an implementation, the third metal-containing layer may include a metal nitride layer, and the fourth metal-containing layer may include a metal layer. The third and fourth metal-containing layers may undergo a planarization process to form the second barrier pattern BM2 and the second conductive pattern FM2.

At least one of the interconnection lines IL may include a via VI. The interconnection line IL may be electrically connected through the via VI to one or more of the active contacts AC and the gate contacts GC.

Figure 16:
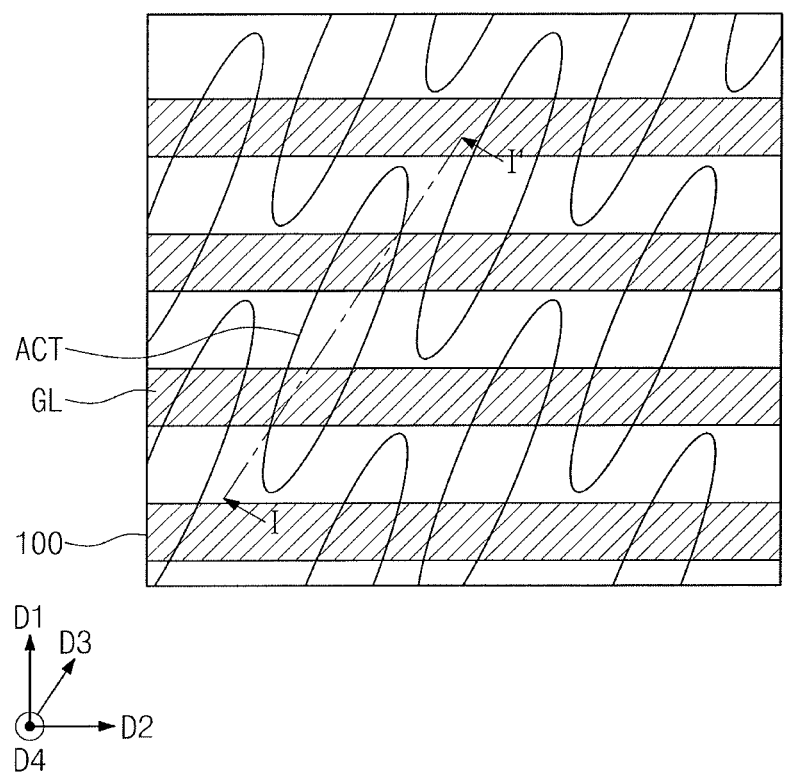
FIGS. 16 and 18 illustrate plan views of stages in a method of manufacturing a semiconductor device according to some example embodiments.
Figure 17:
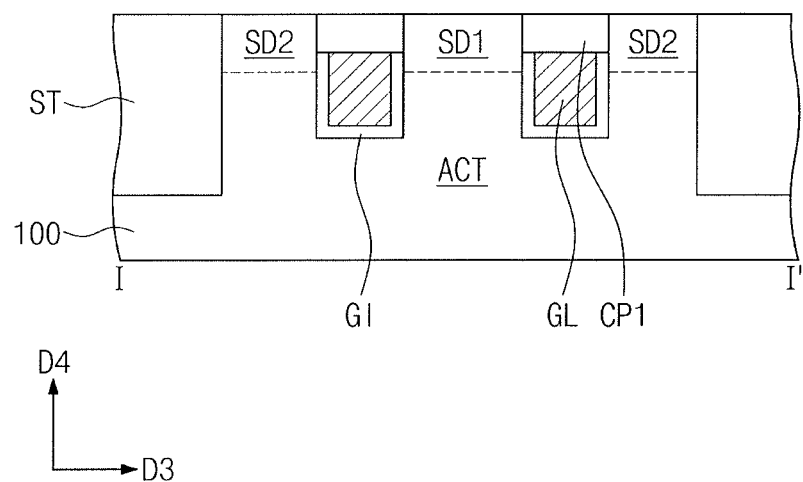
FIGS. 17 and 19 illustrate cross-sectional views taken along line I-I' of FIGS. 16 and 18, respectively.
Figure 18:
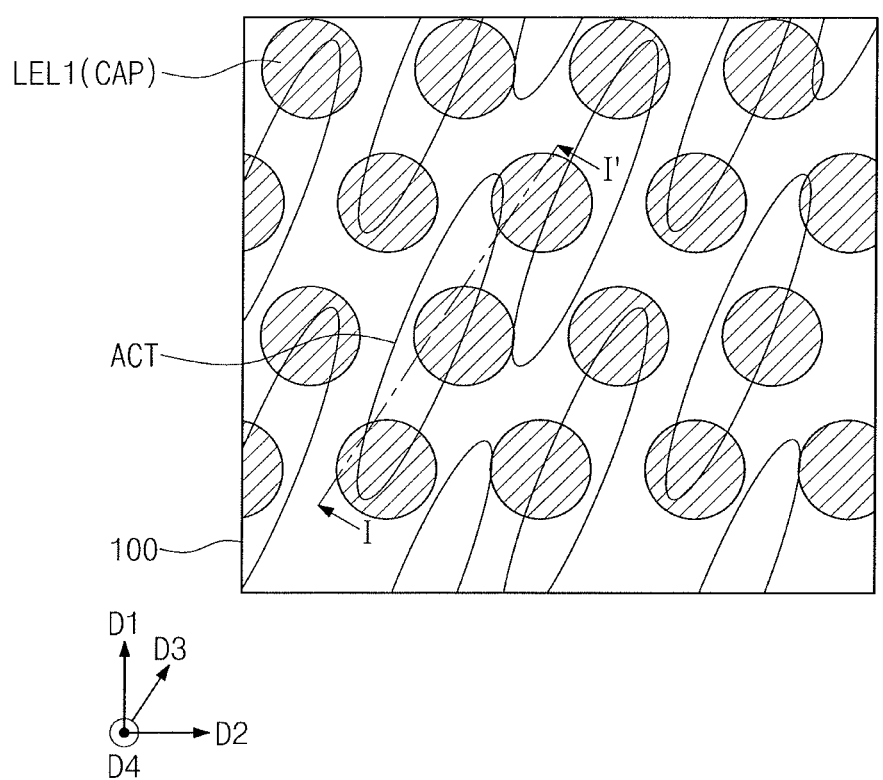
Figure 19:
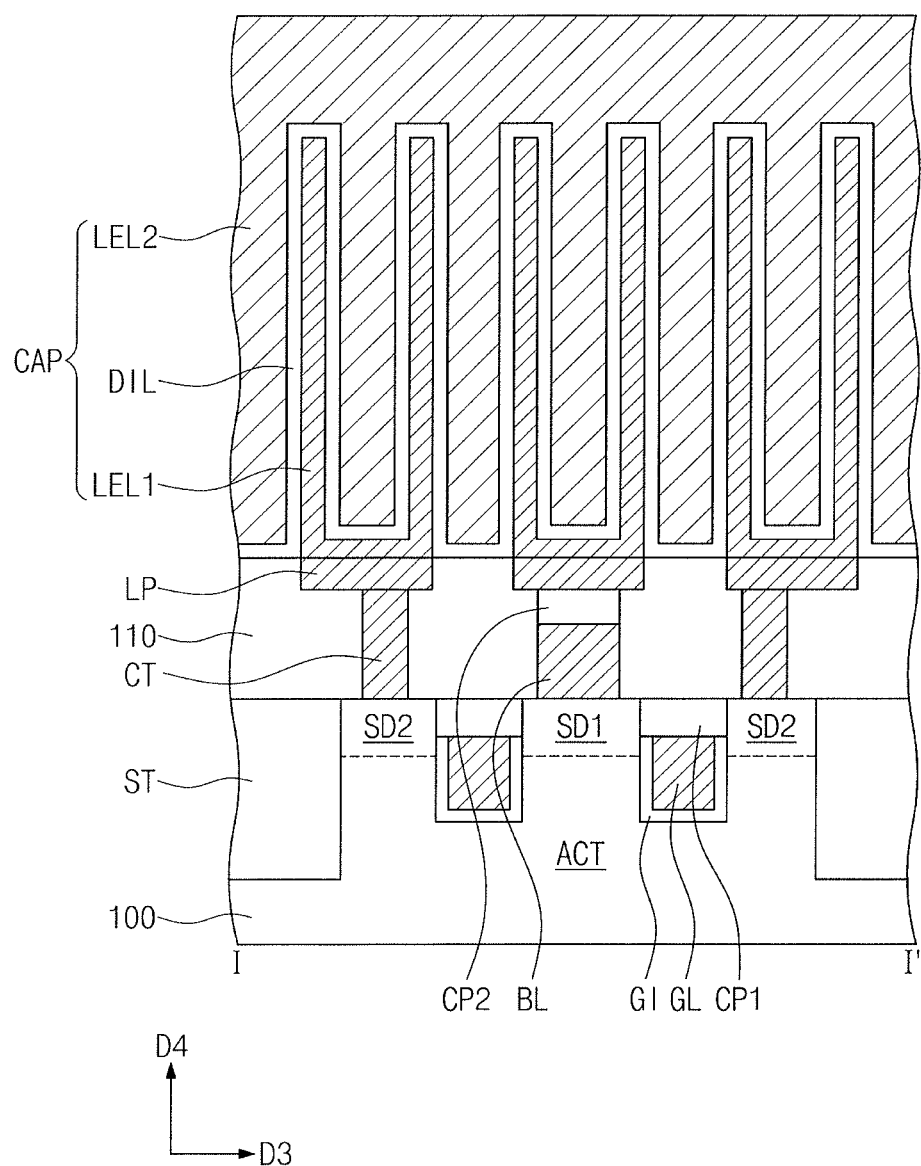

FIGS. 16 and 18 illustrate plan views showing stages in a method of manufacturing a semiconductor device according to some example embodiments. FIGS. 17 and 19 illustrate cross-sectional views taken along line I-I' of FIGS. 16 and 18, respectively.

Referring to FIGS. 16 and 17, a substrate 100 may be provided thereon with a device isolation layer ST defining active patterns ACT. The substrate 100 may be, e.g., a silicon substrate, a germanium substrate, or a silicon-on-insulator (SOI) substrate. Silicon oxide may be used to form the device isolation layer ST.

When viewed in plan, each of the active patterns ACT may have a bar shape. Each of the active patterns ACT may have a major axis in a third direction D3. A third direction D3 may intersect first and second directions D1 and D2. The first, second, and third directions D1, D2 and D3 may all be parallel to a top surface of the substrate 100.

Gate lines GL may be formed in the substrate 100, running across the active patterns ACT. The gate lines GL may extend in the second direction D2 and may be arranged along the first direction D1. The gate lines GL may be formed to be buried in the substrate 100.

The gate lines GL may include, e.g., a conductive metal nitride (e.g., titanium nitride or tantalum nitride) or a (non-compounded) metal (e.g., titanium, tantalum, cobalt, tungsten, ruthenium, molybdenum, tin, copper, or aluminum). The formation of the gate lines GL may include the formation of the metal-containing layer ML discussed above with reference to FIGS. 1 to 7 according to some example embodiments.

Gate dielectric layers GI may be formed between the gate lines GL and the active patterns ACT. The gate dielectric layers GI may include a high-k dielectric material whose dielectric constant is greater than that of a silicon oxide layer.

First capping patterns CP1 may be formed on corresponding gate lines GL. The first capping patterns CP1 may have top surfaces that are substantially coplanar with that of the substrate 100. In an implementation, the first capping patterns CP1 may include, e.g., SiON, SiCN, SiCON, or SiN.

A first source/drain region SD1 may be formed on each of the active patterns ACT, and on the each of the active patterns ACT, second source/drain regions SD2 may be formed spaced apart from each other across the first source/drain region SD1. The first source/drain region SD1 may be formed between a pair of gate lines GL neighboring each other. The second source/drain regions SD2 may be formed on opposite sides of the pair of gate lines GL. For example, the second source/drain regions SD2 may be spaced apart from each other across the pair of gate lines GL. The first source/drain region SD1 may have the same conductive type as that of the second source/drain region SD2.

Referring to FIGS. 18 and 19, a first interlayer dielectric layer 110 may be formed on the substrate 100, covering the active patterns ACT. The first interlayer dielectric layer 110 may be formed of a silicon oxide layer or a silicon oxynitride layer.

Bit lines BL may be formed in the first interlayer dielectric layer 110. The bit lines BL may extend in the first direction D1 and may be arranged along the second direction D2. Each of the bit lines BL may be electrically connected to the first source/drain region SD1. The bit lines BL may include, e.g., a metal or a conductive metal nitride. The formation of the bit lines BL may include the formation of the metal-containing layer ML discussed above with reference to FIGS. 1 to 7 according to some example embodiments.

Second capping patterns CP2 may be formed on corresponding bit lines BL. For example, the second capping patterns CP2 may include SiON, SiCN, SiCON, or SiN.

On the substrate 100, contacts CT may be formed to penetrate the first interlayer dielectric layer 110 and to have connection with corresponding second source/drain regions SD2. Landing pads LP may be formed on corresponding contacts CT. The contacts CT and the landing pads LP may include, e.g., a metal or a conductive metal nitride. The formation of the contacts CT and the landing pads LP may include the formation of the metal-containing layer ML discussed above with reference to FIGS. 1 to 7 according to some example embodiments.

Capacitors CAP may be formed on corresponding landing pads LP. The formation of the capacitor CAP may include forming a first electrode LEL1 on the landing pad LP, forming a dielectric layer DIL on the first electrode LEL1, and forming a second electrode LEL2 on the dielectric layer DIL. The first electrode LEL1 may be electrically connected to the second source/drain region SD2 through the landing pad LP and the contact CT.

When viewed in plan as illustrated in FIG. 18, the first electrodes LEL1 may be arranged in a zigzag fashion along the first direction D1. The first electrodes LEL1 may be linearly arranged along the third direction D3.

The first and second electrodes LEL1 and LEL2 may independently include, e.g., a metal or a conductive metal nitride. The formation of the first and second electrodes LEL1 and LEL2 may include the formation of the metal-containing layer ML discussed above with reference to FIGS. 1 to 7 according to some example embodiments.

The first electrode LEL1 or the second electrode LEL2 may include the second metal M2 of the reducing agent RA discussed above with reference to FIGS. 1 to 7. An amount of the second metal M2 included in the first electrode LEL1 or the second electrode LEL2 may be, e.g., about 0.1 at % to about 10 at %.

Figure 20:
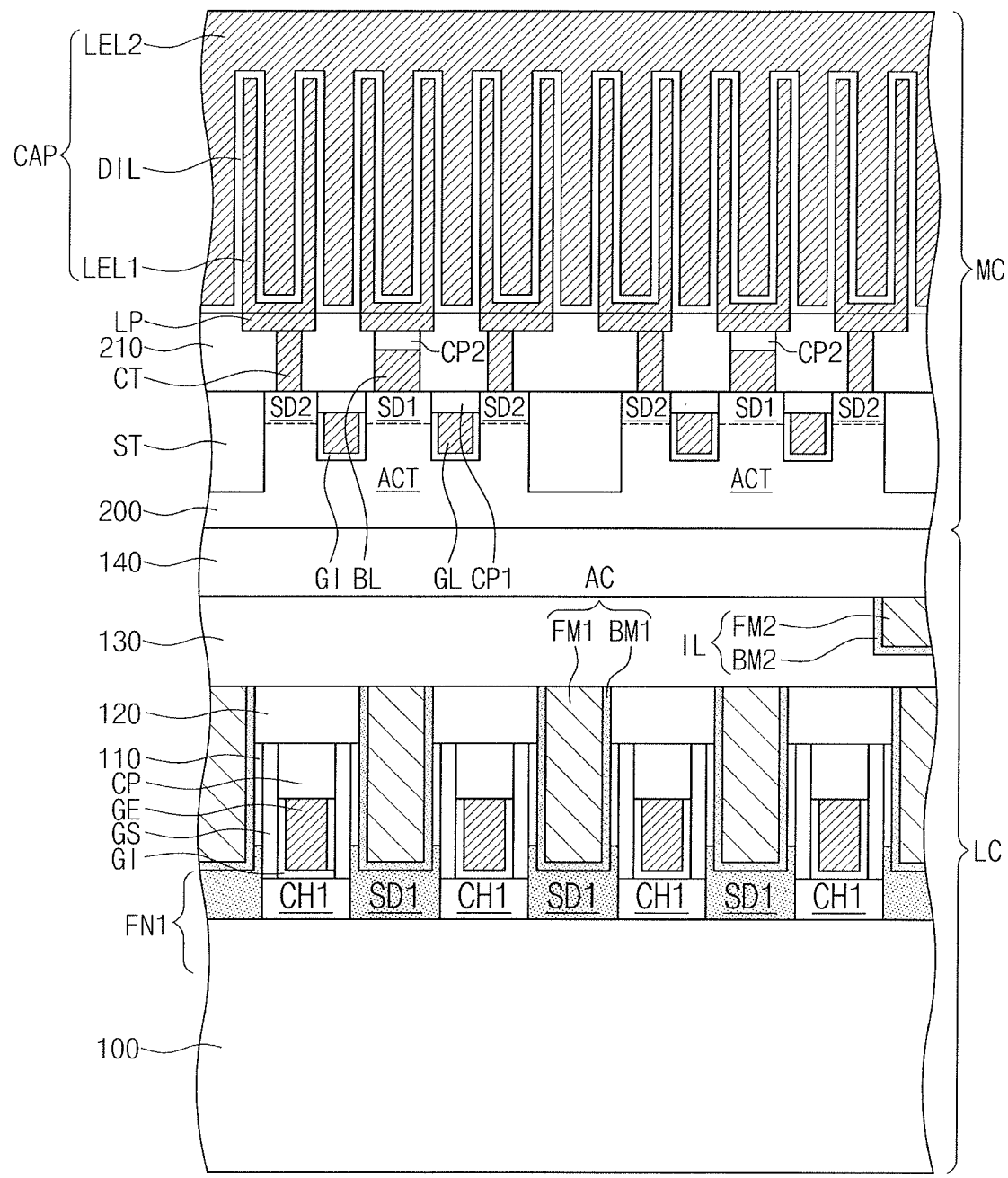
FIG. 20 illustrates a cross-sectional view showing a semiconductor device according to some example embodiments.

FIG. 20 illustrates a cross-sectional view showing a semiconductor device according to some example embodiments. In the embodiment that follows, a repeated description of technical features corresponding with reference to FIGS. 8 to 19 may be omitted, and a difference thereof will be discussed in detail.

Referring to FIG. 20, a logic region LC may be provided that corresponds to a resultant structure of FIGS. 14 and 15A to 15C. The logic region LC may include logic transistors that constitute a logic circuit of a semiconductor device.

A fourth interlayer dielectric layer 140 may be formed on the logic region LC. A memory region MC corresponding to a resultant structure of FIGS. 18 and 19 may be formed on the fourth interlayer dielectric layer 140. The memory region MC may be formed to overlie on the logic region LC. The memory region MC may include a memory cell in which DRAM devices are disposed.

For example, a semiconductor layer 200 of the memory region MC may be formed on the fourth interlayer dielectric layer 140. The semiconductor layer 200 may be substantially the same as the substrate 100 discussed with reference to FIGS. 16 to 19. Memory transistors and capacitors CAP electrically connected thereto may be formed on the semiconductor layer 200. Detailed descriptions about the formation of the memory transistors and the capacitors CAP may be substantially the same as those discussed above with reference to FIGS. 16 to 19.

While the memory region MC is formed on the logic region LC, the logic transistors in the logic region LC may be exposed to process conditions for the fabrication of the memory region MC. For example, if the memory region MC were to be fabricated at high temperatures (e.g., about 500° C. or higher), the logic transistors of the logic region LC could also be exposed to the high temperatures. In this case, the high temperatures could deteriorate the logic transistors. This situation could have a significant negative influence on reliability of a semiconductor device.

According to some examples, a reducing agent may be used to form a metal-containing layer at low temperatures (e.g., between about 150° C. and 400° C.). For example, when a metal-containing layer is formed to act as the gate line GL, the bit line BL, the contact CT, the landing pad LP, or the capacitor CAP of the memory region MC, a low process temperature may maintain by using the method of forming a metal-containing layer according to some example embodiments. Consequently, it may be possible to prevent deterioration of the logic transistors of the logic region LC and to improve reliability of a semiconductor device.

By way of summation and review, semiconductor devices have increased integration with the advanced development of the electronic industry. During manufacturing of semiconductor devices, there may be concerns regarding process margin reduction in an exposure process defining fine patterns. Semiconductor devices also have increased in speed with the advanced development of the electronic industry. Various studies have been conducted regarding high integration and/or high speed in semiconductor devices.

The method of forming a metal-containing layer according to an embodiment may use a reducing agent in forming a metal-containing layer at low temperatures (e.g., between 150° C. and 400° C.). Because the metal-containing layer can be formed at low temperatures, deterioration of the semiconductor device may be prevented, and reliability may be increased.

One or more embodiments may provide a method of manufacturing a semiconductor device, which method includes a method of forming a metal-containing layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   providing a metal precursor on a substrate to form a preliminary layer that includes a first metal;
   providing a reducing agent on the preliminary layer, the reducing agent including a compound that includes a second metal; and providing a reactant on the preliminary layer to form a metal-containing layer,
wherein:
the second metal has multiple oxidation states, the second metal in the reducing agent having a lower oxidation state among the multiple oxidation states prior to providing the reducing agent on the preliminary layer, and
the second metal is included in the metal-containing layer in an amount of 0 at % to less than 5 at %.

2. The method as claimed in claim 1, wherein the second metal includes Cr, Co, Mo, Ru, Ir, Pt, Cu, Fe, W, Ti, V, Mn, Ni, or Sn.

3. The method as claimed in claim 1, further comprising purging the reducing agent after providing the reducing agent on the preliminary layer.

4. The method as claimed in claim 1, wherein providing the reducing agent on the preliminary layer:
oxidizes the reducing agent to increase an oxidation number of the second metal, and
reduces the first metal in the preliminary layer to decrease an oxidation number of the first metal.

5. The method as claimed in claim 1, wherein the metal precursor includes a metal halide compound containing the first metal or a metal organic compound containing the first metal.

6. The method as claimed in claim 1, wherein the reactant includes $NH_3$, $N_2H_4$, $H_2$, or $N_2$.

7. The method as claimed in claim 1, wherein forming the metal-containing layer includes performing an atomic layer deposition process or a chemical vapor deposition process.

8. The method as claimed in claim 1, wherein the method is performed at a process temperature of about 150° C. to about 400° C.

9. The method as claimed in claim 1, wherein the method is performed at a process pressure of about 0 Torr to about 100 Torr.

10. The method as claimed in claim 1, wherein the second metal includes Cr, Co, Mo, Ir, Pt, Cu, Fe, W, Ti, V, Mn, Ni, or Sn.

11. A method of manufacturing a semiconductor device, the method comprising:
forming an active pattern on a substrate;
forming a gate electrode running across the active pattern;
forming an active contact electrically connected to the active pattern and a gate contact electrically connected to the gate electrode,
wherein:
forming the active contact and the gate contact includes:
forming a first hole exposing the active pattern and a second hole exposing the gate electrode; and
forming a first metal-containing layer in the first hole and the second hole, forming the first metal-containing layer includes:
providing a first metal precursor on the substrate to form a first preliminary layer that includes a first metal; and
providing a first reducing agent on the first preliminary layer, the first reducing agent including a compound that includes a second metal, the second metal having multiple oxidation states, and the second metal in the first reducing agent having a lower oxidation state among the multiple oxidation states prior to providing the first reducing agent on the first preliminary layer, and
the second metal is included in the first metal-containing layer in an amount of 0 at % to less than 5 at %.

12. The method as claimed in claim 11, wherein the second metal includes Cr, Co, Mo, Ru, Ir, Pt, Cu, Fe, W, Ti, V, Mn, Ni, or Sn.

13. The method as claimed in claim 11, wherein:
forming the first metal-containing layer further includes providing a reactant on the first preliminary layer, and
the reactant includes $NH_3$, $N_2H_4$, $H_2$, or $N_2$.

14. The method as claimed in claim 11, further comprising forming a second metal-containing layer in the first hole and the second hole, wherein
the first metal-containing layer includes a metal nitride layer, and
the second metal-containing layer includes a metal layer.

15. The method as claimed in claim 11, further comprising forming a plurality of interconnection lines on the active contact and the gate contact such that the interconnection lines are electrically connected to the active contact and the gate contact,
wherein:
forming the interconnection lines includes forming a second metal-containing layer,
forming the second metal-containing layer includes:
providing a second metal precursor on the substrate to form a second preliminary layer that includes a third metal; and
providing a second reducing agent on the second preliminary layer, the second reducing agent including a compound that includes a fourth metal, the fourth metal having multiple oxidation states, and the fourth metal in the second reducing agent having a lower oxidation state among the multiple oxidation states prior to providing the second reducing agent on the second preliminary layer.

16. The method as claimed in claim 11, wherein the second metal includes Cr, Co, Mo, Ir, Pt, Cu, Fe, W, Ti, V, Mn, Ni, or Sn.

17. A method of manufacturing a semiconductor device, the method comprising:
forming a first region including a plurality of transistors; and
forming a second region stacked on the first region,
wherein:
forming the second region includes:
forming a semiconductor layer on the first region;
forming an active pattern on the semiconductor layer; and
forming a capacitor electrically connected to the active pattern,
forming the capacitor includes:
forming a first electrode;
forming a dielectric layer on the first electrode; and
forming a second electrode on the dielectric layer,
forming the first electrode or the second electrode includes:
providing a metal precursor on the semiconductor layer to form a preliminary layer that includes a first metal; and
providing a reducing agent on the preliminary layer, the reducing agent including a compound that includes a second metal, the second metal having multiple oxidation states, and the second metal in the reducing agent having a lower oxidation state among the multiple oxidation states prior to providing the reducing agent on the preliminary layer, and
the second metal is included in the first electrode or the second electrode in an amount of 0 at % to less than 5 at %.

18. The method as claimed in claim 17, wherein the second metal includes Cr, Co, Mo, Ru, Ir, Pt, Cu, Fe, W, Ti, V, Mn, Ni, or Sn.

19. The method as claimed in claim 17, wherein:
    forming the first electrode or the second electrode further includes providing a reactant on the preliminary layer, and
    the reactant includes $NH_3$, $N_2H_4$, $H_2$, or $N_2$.

20. The method as claimed in claim 17, wherein the second metal includes Cr, Co, Mo, Ir, Pt, Cu, Fe, W, Ti, V, Mn, Ni, or Sn.

* * * * *